US 6,660,330 B2

(12) United States Patent
Locke et al.

(10) Patent No.: US 6,660,330 B2
(45) Date of Patent: Dec. 9, 2003

(54) METHOD FOR DEPOSITING METAL FILMS ONTO SUBSTRATE SURFACES UTILIZING A CHAMFERED RING SUPPORT

(75) Inventors: Peter S. Locke, Hopewell Junction, NY (US); Sandra Guy Malhotra, Beacon, NY (US); Fenton Read McFeely, Ossining, NY (US); Andrew Herbert Simon, Fishkill, NY (US); John Jacob Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 09/829,648

(22) Filed: Apr. 10, 2001

(65) Prior Publication Data

US 2002/0146903 A1 Oct. 10, 2002

(51) Int. Cl.[7] .......................... C23C 16/06; C23C 16/18
(52) U.S. Cl. ..................... 427/250; 118/725; 118/728
(58) Field of Search .................... 427/250; 118/715, 118/725, 728

(56) References Cited

U.S. PATENT DOCUMENTS

| 4,913,929 | A | * | 4/1990 | Moslehi et al. ............... 427/39 |
| 5,328,722 | A | * | 7/1994 | Ghanayem et al. .......... 427/250 |
| 5,493,987 | A | * | 2/1996 | McDiarmid et al. ......... 118/715 |
| 5,574,247 | A | * | 11/1996 | Nishitani et al. ............ 118/715 |
| 5,645,646 | A | * | 7/1997 | Beinglass et al. ............ 118/730 |
| 6,077,357 | A | * | 6/2000 | Rossman et al. ............ 118/723 |

* cited by examiner

Primary Examiner—Bret Chen
(74) Attorney, Agent, or Firm—Scully, Scott Murphy & Presser; Robert M. Trapp, Esq.

(57) ABSTRACT

The present invention relates to a method and apparatus for ensuring uniform and reproducible heating of a deformation-tolerant substrate during low-pressure chemical vapor deposition (CVD) of a metal film on a surface of the substrate. The uniform and reproducible heating of the substrate is achieved in the present invention by positioning the substrate on a beveled surface of a chamfered ring which is located above the heating element in a CVD reactor chamber. The space between heating element, chamfered ring and bottom surface of the substrate define a cavity between the substrate and heating element that ensures that the substrate is heated by radiative means rather than direct contact.

19 Claims, 2 Drawing Sheets

METHOD FOR DEPOSITING METAL FILMS ONTO SUBSTRATE SURFACES UTILIZING A CHAMFERED RING SUPPORT

DESCRIPTION

FIELD OF THE INVENTION

The present invention relates to the deposition of metal films using a low-pressure vacuum-based system, and more particularly to the deposition of metal films via chemical vapor deposition (CVD) processes in which accurate and reproducible control of the substrate temperature is necessary to ensure optimal properties of the metal films being deposited. Moreover, the present invention relates to a method and apparatus whereby substrates which may be subject to deformation upon heating can be uniformly and reproducibly heated to the desired processing temperature despite said deformation in a low-pressure cold-walled reactor in which metal films are deposited.

BACKGROUND OF THE INVENTION

During the manufacturing of integrated semiconductor devices, it is oftentimes necessary to or desirable to deposit a metal film upon a substrate. For example, metal depositions may be employed for the formation of field effect transistor (FET) gate electrodes, metal oxide semiconductor (MOS) capacitors, read/write lines for dynamic random access memory (DRAM) devices, various contacts, multilevel wiring arrays and other various applications. An important method for effecting such deposition is CVD, especially in situations in which conformal coverage of a structured substrate is necessary.

In most typical CVD processes, the following four steps are essential: (1) The substrate to be coated must be placed within an enclosed vessel (i.e., reactor). (2) The substrate must be brought to the desired temperature to effect the intended deposition. (3) The substrate at temperature, T, will be exposed, typically under continuous flow conditions, to a gas mixture comprising precursor gas molecules (i.e., molecules containing metal atoms), any required co-reactant molecules such as reducing agents or other such molecules which might chemically react with the precursor molecules during deposition, and any carrier gas required to control the transport of reactive chemical species to and through the reactor. The total pressure of this entire gas mixture, which is referred to as P (i.e., the reaction pressure) herein, may or may not be constant during the deposition process. It is further understood that the composition of the gas mixture may also vary during the deposition process, i.e., the gas mixture may have differing proportions of carrier gas, precursor, and co-reactants. (4) The resultant substrate containing deposited metal film must be removed from the reactor.

It is very difficult, and in some instances, nearly impossible to achieve a uniform and reproducible substrate temperature T. This is especially the case under circumstances in which the requirements for producing metal films having requisite properties make it necessary to conduct the CVD process at a value of P of less than about 1 torr, and wherein the reactor employed is a cold-walled reactor. The term "cold-walled reactor" as used herein denotes any reactor which possesses surfaces within the line of sight of the substrate undergoing the deposition that are 50° C. or more colder than the reaction temperature, $T_{rxn}$.

In a prior art cold-walled reactor, the substrate is brought to the reaction temperature, $T_{rxn}$, by means of a heater, which is typically a ceramic pedestal enclosure possessing internal heating elements situated within the reactor vacuum upon which the substrate is disposed. In such a system, the reaction temperature of the substrate is achieved by a dynamic balance of heat input from the heater into the substrate and heat loss from the substrate to the reactor surroundings, by, for example, radiative heat loss. Where the temperature difference between the reaction temperature and the reactor walls is large, the radiative heat losses of the substrate to its surroundings may be quite significant necessitating the operation of the heater at temperatures well above T, in order to bring the substrate disposed upon it to T. In such a dynamic situation, it is extremely difficult to reliably and reproducibly heat substrates uniformly to the desired substrate temperature.

The standard prior art method for providing a good reproducible thermal link between the heater and the substrate is by chucking. The term "chucking" as used herein denotes any process which applies a force between the substrate and the heater (other than the force provided by weight of the substrate). Unfortunately, none of the prior art chucking schemes including mechanical, vacuum and electrostatic is applicable to low-pressure metal CVD processes.

Mechanical chucking, such as a clamping system, is always undesirable, as it produces a substrate with uncoated bare spots where the clamp touches the substrate. This is frequently intolerable in itself. Moreover, deposition on the clamping mechanism can give rise to particulate contamination.

Vacuum chucking is not viable because such chucking does not work at the low-pressures specified above and it is impossible to establish a sufficient absolute pressure differential to achieve adequate vacuum chucking.

Electrostatic chucking, which is suitable for deposition of insulating materials, is unsuitable for metal deposition because the deposition of conductive films, however minute, on the heater surface prevents the maintenance of the requisite static charge. Since the above chucking methods for controlling the thermal link between heater and the substrate are not applicable for low-pressure metal deposition processes, a procedure whereby one simply places the substrate upon the heater is typically employed.

With a simple substrate, such as an extremely flat wafer of bare silicon, simply placing the substrate upon the heater surface might suffice provided that the heater surface is extremely flat such that it contacts the entire substrate in the same way and that there is no significant temperature variations across the heater surface. However, a majority of substrates are more complex. For instance, typical substrates frequently comprise multilayered structures in which the individual layers comprise materials having different coefficients of thermal expansion. Even if such substrates were perfectly flat at room temperature, upon heating to reaction temperature (typically about 200° to about 500° C.) the substrates would substantially deform. This is the same physical principal responsible for the operation of ordinary bimetallic strip household thermostats.

FIG. 1 is a pictorial representation of a prior art method of heating a substrate by placing the substrate on the surface of the heater without any holding means. Specifically, FIG. 1 comprises reactor chamber 10 having heater 12 therein. As shown, substrate 14 is placed on the surface of heater 12 and during heating only the center portion of the substrate (labeled as 16 in the drawing) is heated by direct contact with the heater body. That is, the substrate tends to warp substantially during the deposition of metal films thereon.

This phenomenon is caused by stresses resulting from having layers of various materials on the substrate that have different coefficients of thermal expansion. The only direct source of heat to the substrate edges (labeled as 18 in the drawing) is by radiation from the heater. Note the presence of gap 20 between substrate edges 18 and heater 10. When a multilayered substrate is heated to 400–500° C. distortions up to a millimeter or so between the center and edges can be observed.

There are several problems associated with the situation depicted in FIG. 1. First, it is clear that the non-uniform power input into the substrate will lead to temperature variations across the substrate. These temperature variations, in turn, can produce undesirable variations in either thickness of the deposited metal films, its intensive properties or both. Second, even the average temperature on the substrate will be too sensitive to the details of the individual substrates. Different degrees of deformation will clearly result in different average substrate temperatures as the thermal link between the substrate and heater is being modified thereby. Since heating at the substrate edges may be largely radiative, the final substrate temperature may also depend upon the reflectivity of the back surface (e.g., polished vs. unpolished).

In short, the substrate temperature actually obtained could be a sensitive function of the composition and back surface finish of the substrate, as well as heater temperature. At the very least, this would necessitate frequent time-consuming recalibrations of the reactor every time substrates with even slightly different properties are introduced for deposition. In addition, the opening of a gap between the substrate edges and the heater will allow deposition of metal directly onto the surface of the heater, further changing its thermal transfer characteristics as well as being a potential source for particulate contamination.

In view of the drawbacks mentioned hereinabove with prior art metal chemical vapor deposition processes, there is a continued need for providing a new and improved CVD process in which accurate and reproducible control of the substrate temperature is provided thereby ensuring optimal properties of the deposited metal films. A new and improved CVD method is especially needed in cases wherein substrates that are subjected to deformation upon heating are employed.

SUMMARY OF THE INVENTION

One object of the present invention is to provide a low-pressure metal CVD process (on the order of about 1 torr or less) and apparatus in which accurate and reproducible control of the substrate temperature is provided.

Another object of the present invention is to provide a low-pressure metal CVD process and apparatus that work in cases wherein substrates that are typically susceptible to deformation (i.e., warping) upon heating are employed.

A further object of the present invention is to provide a low-pressure metal CVD process and apparatus that work when cold-walled reactors are employed.

A yet further object of the present invention is to provide a low-pressure metal CVD process and apparatus in which a reproducible thermal link between substrate and heater is maintained without the need of any mechanical chucking means, vacuum chucking means or electrostatic chucking means.

These and other objects and advantages are achieved in the present invention by introducing a chamfered ring disposed above the heater surface and by placing the substrate upon the chamfered ring rather than on the heater surface so that the substrate is resting on the internal chamfered surface. The term "chamfered ring" as used herein denotes a ring in which a groove or bevel is formed therein. Thus, in the present invention, the substrate is disposed above the surface of the heater (typically by a few millimeters) so that the substrate is now entirely heated by radiation by the heater instead of contact heating.

The chamfered ring, the top of the heater and the bottom surface of the substrate define a cavity that contains most of the radiation emanating from the heater. The integrity of this cavity is substantially preserved even if the substrate deforms in the manner described above. Thus, the thermal transfer between the heater and the substrate will, in contrast to the prior art, not be strongly affected by the deformation of the substrate. This leads to superior reproducibility and constancy of substrate temperature and also serves to obviate the problem of deposition on the heater itself.

In one aspect of the present invention, a method of depositing a metal film on a surface of a substrate using a low-pressure CVD deposition process is provided. Specifically, the method of the present invention comprises the steps of:

(a) positioning a substrate on a beveled surface of a chamfered ring that is located above a heater, wherein said heater and said chamfered ring are inside a chemical vapor deposition reactor chamber; and (b) depositing a metal film on a surface of said substrate at pressures of about 1 torr or less, wherein during said depositing said substrate is not in physical contact with the heater except via the chamfered ring.

Another aspect of the present invention relates to a chemical vapor deposition (CVD) apparatus which comprises:

a reaction chamber including at least a heater and a chamfered ring having a beveled surface, wherein said beveled surface of said chamfered ring is located above said heater at a distance sufficient to form a cavity between said heater and a bottom surface of a substrate placed on said beveled surface so that the substrate is not in physical contact with the heater except via the chamfered ring.

DETAILED DESCRIPTION OF THE INVENTION

The present invention which provides a method and apparatus for depositing a metal film on a surface of a substrate using a low-pressure CVD process will now be described in more detail by referring to FIGS. 2–3 and the discussion that appears hereinbelow. It is noted that in the present invention uniform heating of the substrate to a desired substrate temperature is achieved without the use of prior art chucking means.

Figure 2:
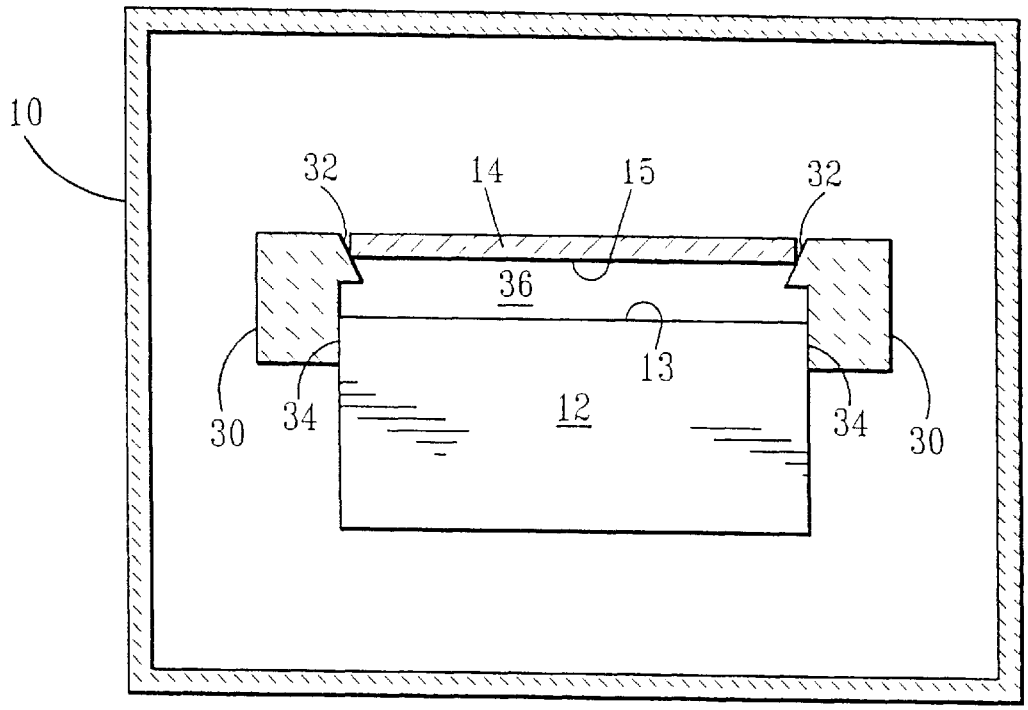
FIG. 2 is a pictorial representation of the inventive chemical vapor deposition apparatus wherein a substrate is placed upon a beveled surface of a chamfered ring that is formed above a heater.

Before discussing the inventive apparatus depicted in FIG. 2 (or FIG. 3), it is noted that the present invention works for all low-pressure chemical vapor deposition (CVD) processes that are well known in the art in which a metal film is deposited and a cold-walled reactor, as defined above, is employed. The term "low-pressure" as used herein denotes a CVD process in which the reaction pressure is about 1 torr or less, with a reaction pressure of from about 25 to about 500 mtorr being more highly preferred. The improvement provided herein is the use of the apparatus shown in FIG. 2 or FIG. 3. Thus, the present invention is not limited to specific types of metallic precursors, carrier gases, co-reactants and CVD reaction conditions. Instead, a wide variety of materials and CVD conditions that are well known to those skilled in the art can be employed in the present invention.

For example, the metallic precursors employed in the present invention may include any number of precursor compounds or complexes which are capable of forming a metal film (including multilayers) on a surface of a substrate by low-pressure CVD. Thus, the present invention contemplates the use of a wide variety of metallic precursors including, but not limited to: organometallic compounds or complexes, inorganic compounds or complexes, or mixtures thereof. Some illustrative examples of suitable metallic precursors that may be employed in the present invention include, but are not limited to: metal carbonyls or derivatives thereof, metal alkyls, metal halides, metal allyls, metal diketonates, and other like metal-containing inorganic or organometallic compounds or complexes. In one highly preferred embodiment of the present invention, the metallic precursor is $W(CO)_6$.

The metallic precursor may be employed neat (i.e., without co-reactants) or it may be admixed with one or more conventional co-reactants such as conventional reducing agents or oxidizing agents. Additionally, the precursor may also be admixed with an inert or noble gas such as $N_2$, He or Ar. Note that the inert (or noble) gas is typically employed as the carrier gas in a low-pressure CVD process. The amounts of the various CVD reactants including metallic precursor, co-reactants, and inert (or noble) gas may vary and are not critical to the operation of the present invention.

As stated above, the CVD process employed in the present invention is not limited to any specific reaction conditions provided that low-pressures and a cold-walled reactor are employed. Therefore, all suitable low-pressure CVD conditions well known to those skilled in the art may be employed herein. Typically, the deposition is carried out at a temperature below about 600° C., preferably at a temperature of from about 150° to about 450° C. Some illustrative reaction conditions that can be employed in the present invention include, but are not limited to:

Reactor Base Pressure: about $10^{-8}$ torr.
Deposition Reaction Pressure: about 2 to about 150 mtorr.
Precursor and Inert Gas Flow Rate: about 100 to about 1000 sccm.
Substrate Temperature: about 380° to about 450° C.

It is again emphasized the above CVD reaction conditions are exemplary, and by no ways limit the present invention.

In the present invention, deformation-susceptible substrates are typically employed. The term "deformation-susceptible substrates" includes any substrate that exhibits some degree of warping caused by heating during the deposition process. Illustrative types of deformation-susceptible substrates that may be employed in the present invention include, but are not limited to: semiconductor materials such as Si, Ge, Ga, SiGe, GaAs, InP, InAs, and other III/V compound semiconductors; layered semiconductors such as Si/SiGe and Si/Si; silicon-on-insulators (SOIs); dielectric materials including organic and inorganic dielectrics; diffusion barrier layers such as Ti, Ta, TiN, TaN and $W_2N$; other metallic films; and any combinations or multilayers thereof.

The inventive method thus finds a wide range of applications including, but not limited to: use in fabricating transistors including complementary metal oxide semiconductor (CMOS) transistors, and field effect transistors (FETs); resistors; capacitors; memory cells (including gate conductors, wordlines and bitlines); wiring structures (including metallic lines and vias); interconnect structures (including metal lines and vias) and other like applications in which a deposited metal film is required.

Notwithstanding the specifics of the low-pressure CVD process and the substrate used, the inventors have unexpectedly found that uniform heating across the entire substrate, which can be substantially reproduced between various substrates, can be achieved by positioning the substrate on a beveled surface of a chamfered ring. A portion of the inventive apparatus which includes the chamfered ring is shown, for example, in FIG. 2.

Specifically, FIG. 2 shows a pictorial representation of a portion of a CVD apparatus which includes at least reactor chamber 10 (i.e., a cold-walled reactor) having heater 12 formed in a predetermined location inside the reactor chamber. The reactor chamber also includes chamfered ring 30 having beveled surface 32 in which substrate 14 is placed thereon. As shown, edges 34 of the chamfered ring are in direct contact with edge portions of heater 12. For clarity, the gas inlet lines including gas nozzle and gas heater; vacuum lines; cooling elements and other like elements that are typically present in a CVD reactor chamber are not depicted in the drawing of the present invention. These elements are however meant to be included with the inventive apparatus shown in FIG. 2.

The heater employed in the present invention includes any conventional heating element that is typically present in the reactor chamber of a typically CVD apparatus. For example, the heater may be a heating plate, heating coil, and other like heating elements. In some embodiments, the heater may be encased within a ceramic housing member.

When one of the above mentioned substrates is placed on beveled surface 32, cavity 36 is formed in the inventive apparatus; the area of cavity 36 is defined by heater top surface 13, chamfered ring 30 and bottom surface 15 of substrate 14. Note that the surface of the substrate that is opposite to bottom surface 15 is the surface of the substrate in which a metallic film will be deposited thereon.

Note that in the present invention a strong thermal link between substrate 14 and heater 12 caused by chucking of the substrate is not provided. Instead, in the present invention the chamfered ring serves to weaken the thermal contact between the substrate and the heater. This is done, however, in such a manner as to make the inventive apparatus more uniform and more insensitive to temperature-induced deformations of the substrate.

Figure 1:
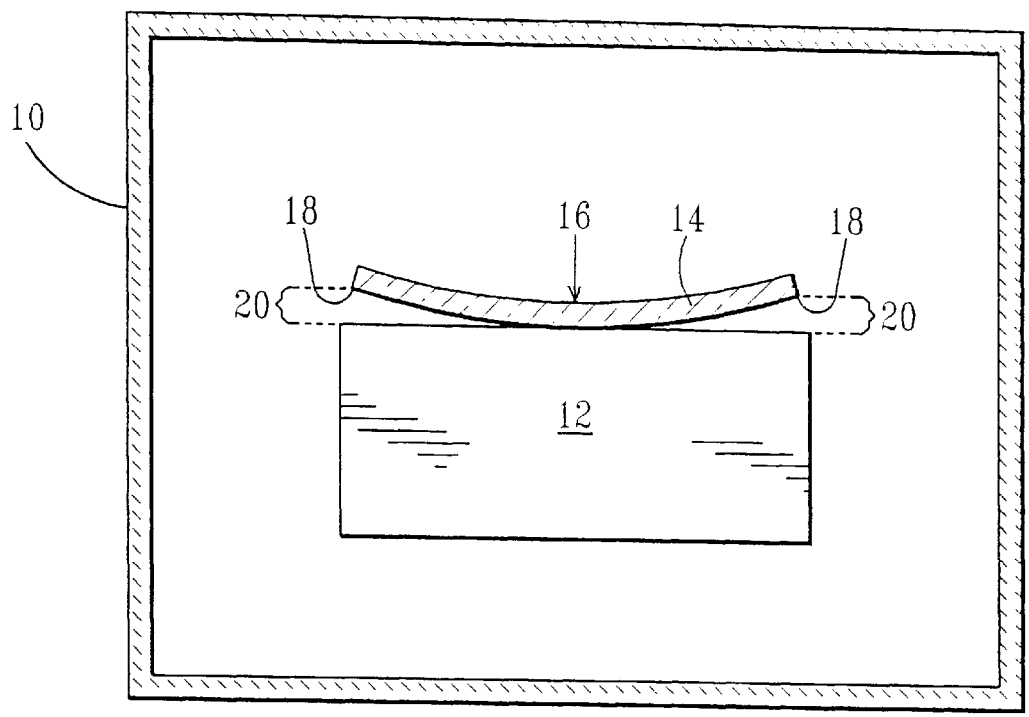
FIG. 1 is a pictorial representation of a prior art chemical vapor deposition apparatus wherein a substrate is placed directly upon a heater without the presence of any prior art chucking means.

The beveled surface of the chamfered ring makes the inventive apparatus shown in FIG. 2 somewhat self-aligning, and it tends to minimize the direct physical contact between the heater and substrate. In contrast to the prior art apparatus illustrated in FIG. 1, where part of the substrate is heated by direct physical contact with the heater, and other parts of the substrate are heated by radiative means, the only effective heating mechanism for the substrate in the inventive apparatus illustrated in FIG. 2 is by radiative means which is contained within cavity 36. It is noted that conductive heating via deposition gases is relatively unimportant in the present invention since low-pressures are employed.

As substrate 14 warps due to heating, the substantially closed nature of cavity 36 is maintained; therefore, heat transfer will continue to be uniform such that the final temperature of the substrate is in steady state with the heater and its surroundings will be only minimally affected by deformation.

Typically, the distance between substrate bottom surface 15 and heater top surface 13 is on the order of from about 2 to about 10 mm, with a distance of about 5 mm being more preferred. If tighter control is desired, the chamfered ring dimensions may be altered to move the substrate still further from the heater, and the heater temperature could be raised to compensate for the weakening of thermal transfer caused by the changed in distance between the substrate and heater.

In addition to deformation tolerance, there are two other advantages gained by employing the inventive apparatus shown in FIG. 2. First, heating is no longer sensitive to the flatness and finish of the heater surface. Second, hot spots on the surface of the heater are much less of a problem as the hot spots will radiate to the entire substrate (albeit with varying solid angle) instead of directly contacting a local spot.

By weakening the thermal link between the substrate and the heater, the apparatus shown in FIG. 2 may require a somewhat higher heater temperature than the prior art system to sustain the substrate at the same temperature. This effect is generally not large and is straightforward to overcome by suitable choice of a heater that operates at higher output energies. The weakness of the thermal link in the apparatus depicted in FIG. 2 may result in excessive substrate heat-up times, if the heat-up is conducted at, or below the reaction pressure, P. This problem, however, may be alleviated by the simple expedient of flowing an inert gas into the reactor during the heat-up stage. The inert gas may be a noble gas or any other sufficiently unreactive gas such as molecular $N_2$. Once the pressure of the inert (or noble) gas in the reactor chamber, and specifically within the cavity, exceeds about 1 torr, convective heat transfer between the heater and the substrate will begin to be important and the substrate temperature can be rapidly increased. An inert (or noble) gas pressure of from about 1 and 10 torr may be employed in the heat-up stage.

Figure 3:
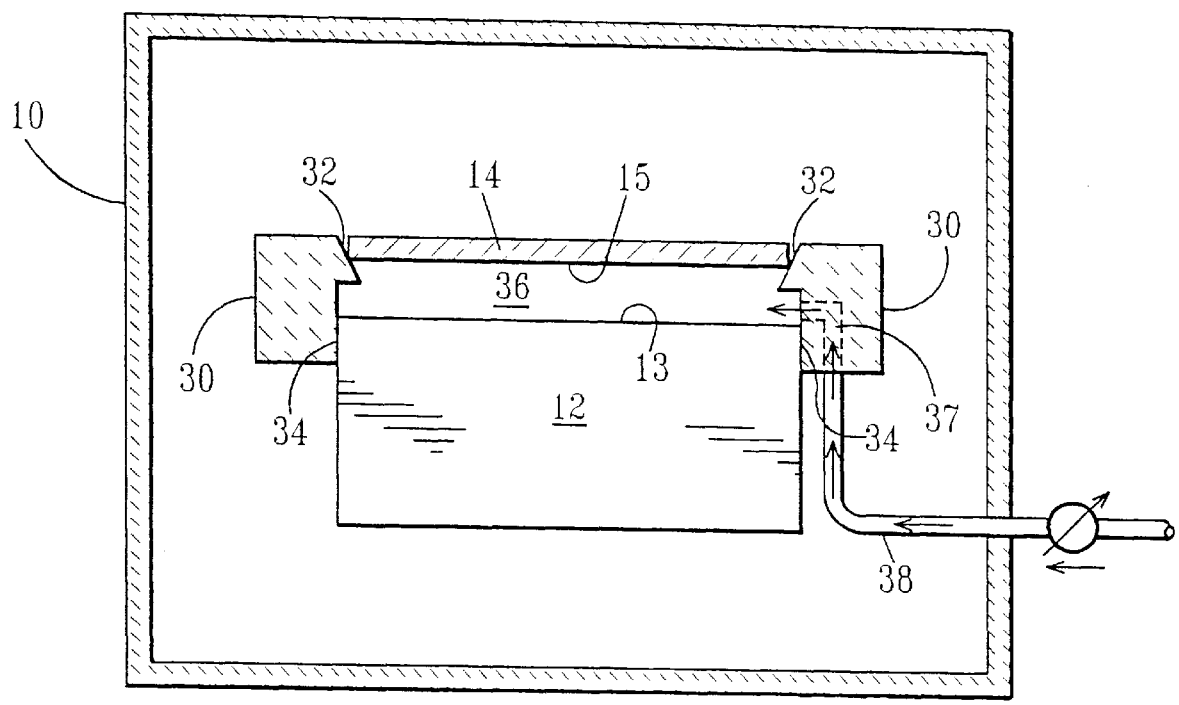
FIG. 3 is a pictorial representation of an alternative chemical vapor deposition apparatus of the present invention wherein a substrate is placed upon a beveled surface of a chamfered ring that is formed above a heater. In this embodiment, the chamfered ring has an orifice or orifices formed therein.

FIG. 3 shows an embodiment of the present invention wherein the heat-up gas is injected directly into cavity 36 by means of a conveying orifice or orifices 37 in heater 12 or in chamfered ring 30 and suitable tubing 38 to connect the orifice(s) to a controlled gas source (not shown).

In accordance with one of the objects of the present invention, the inventive method and apparatus are capable of maintaining a substantially uniform temperature across the substrate during metal film deposition. Under some operation conditions, it is possible to maintain a constant temperature across the substrate to better than ±5° C.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention is not limited to the exact forms and details described and illustrated, but fall within the scope of the appended claims.

Having thus described our invention in detail, what we claim as new and desire to secure by the Letters Patent is:

1. A method for depositing a metal film on a surface of a substrate comprising the steps of:
   (a) positioning a substrate on a beveled surface of a chamfered ring that is located above a heater, wherein said heater and said chamfered ring are inside a chemical vapor deposition reactor chamber; and
   (b) depositing a metal film on a surface of said substrate at pressures of about 1 torr or less, wherein during said depositing said substrate is not in physical contact with the heater except via the chamfered ring.

2. The method of claim 1 wherein said substrate is selected from the group consisting of a semiconductor material, a layered semiconductor, a silicon-on-insulator, a dielectric material, a diffusion barrier, a metallic film and combinations or multilayers thereof.

3. The method of claim 2 wherein said substrate is a semiconductor material selected from the group consisting of Si, Ge, Ga, SiGe, GaAs, InP, InAs, and other III/V compound semiconductors.

4. The method of claim 1 wherein step (b) includes the use of a metallic precursor.

5. The method of claim 4 wherein said metallic precursor is selected from the group consisting of organometallic compounds or complexes, inorganic compounds or complexes, and mixtures thereof.

6. The method of claim 5 wherein said metallic precursor is a metal carbonyl, a metal halide, a metal allyl or a metal diketonate.

7. The method of claim 4 wherein said metallic precursor is $W(CO)_6$.

8. The method of claim 4 wherein step (b) further includes one or more co-reactants.

9. The method of claim 8 wherein said one or more co-reactants is a reducing agent or an oxidizing agent.

10. The method of claim 4 wherein step (b) further includes an inert or noble gas.

11. The method of claim 1 wherein said pressure is from about 25 to about 500 mtorr.

12. The method of claim 1 wherein step (b) is carried out at a temperature of less than about 600° C.

13. The method of claim 12 wherein said temperature is from about 150° to about 450° C.

14. The method of claim 1 wherein said heater and said substrate are spaced apart by a cavity.

15. The method of claim 1 wherein said heater and said substrate are spaced apart by a distance of from about 2 to about 10 mm.

16. The method of claim 15 wherein said distance is about 5 mm.

17. The method of claim 1 wherein an orifice or a plurality of orifices are formed in the chamfered ring.

18. A method for forming a W layer on a surface of a substrate, said method comprising the steps of:
   (a) positioning a substrate on a beveled surface of a chamfered ring that is located above a heater, wherein said heater and said chamfered ring are inside a chemical vapor deposition reactor chamber; and
   (b) depositing a W film on a surface of said substrate at pressures of about 1 torr or less using a $W(CO)_6$ precursor, wherein during said depositing said substrate is not in physical contact with the heater except via the chamfered ring.

19. A method for depositing a metal film on a surface of a substrate comprising the steps of:
  (a) positioning a substrate on a beveled surface of a chamfered ring that is located atop a heater, where positioning said substrate on said beveled surface forms a cavity containing radiation from said heater, wherein said heater and said chamfered ring are inside a chemical vapor deposition reactor chamber;
  (b) uniformly heating said substrate; and
  (c) depositing a metal film on a surface of said substrate at pressures of about 1 torr or less, wherein during said depositing said substrate is not in physical contact with the heater except via the chamfered ring.

* * * * *